United States Patent
Hing et al.

(10) Patent No.: US 8,535,998 B2
(45) Date of Patent: Sep. 17, 2013

(54) METHOD FOR FABRICATING A GATE STRUCTURE

(75) Inventors: Fung Ka Hing, Hsinchu (TW); Haiting Wang, Hsinchu (TW); Han-Ting Tsai, Kaoshiung (TW); Chun-Fai Cheng, Hsinchu (TW); Wei-Yuan Lu, Taipei (TW); Hsien-Ching Lo, Taoyuan (TW); Kuan-Chung Chen, Taipei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/720,075

(22) Filed: Mar. 9, 2010

(65) Prior Publication Data

US 2011/0223752 A1    Sep. 15, 2011

(51) Int. Cl.
*H01L 21/338* (2006.01)

(52) U.S. Cl.
USPC .... 438/183; 438/763; 438/785; 257/E21.444; 257/E21.632

(58) Field of Classification Search
None
See application file for complete search history.

(56) References Cited

U.S. PATENT DOCUMENTS

| | | | | |
|---|---|---|---|---|
| 5,907,781 A * | 5/1999 | Chen et al. | | 438/303 |
| 6,271,094 B1 * | 8/2001 | Boyd et al. | | 438/287 |
| 7,365,009 B2 * | 4/2008 | Chou et al. | | 438/675 |
| 7,435,636 B1 * | 10/2008 | Hanafi | | 438/183 |
| 2001/0023120 A1 * | 9/2001 | Tsunashima et al. | | 438/585 |
| 2004/0259297 A1 * | 12/2004 | Inumiya et al. | | 438/183 |
| 2008/0102616 A1 * | 5/2008 | Tsunashima et al. | | 438/591 |
| 2009/0011563 A1 * | 1/2009 | Hanafi | | 438/285 |
| 2009/0233451 A1 * | 9/2009 | Tsunashima et al. | | 438/769 |
| 2010/0075478 A1 * | 3/2010 | Chang | | 438/301 |
| 2010/0087056 A1 * | 4/2010 | Chung et al. | | 438/585 |
| 2011/0034019 A1 * | 2/2011 | Yu et al. | | 438/592 |
| 2011/0042728 A1 * | 2/2011 | Cheng et al. | | 257/288 |

* cited by examiner

*Primary Examiner* — Alonzo Chambliss
(74) *Attorney, Agent, or Firm* — Lowe Hauptman & Ham, LLP

(57) ABSTRACT

The present disclosure discloses an exemplary method for fabricating a gate structure comprising depositing and patterning a dummy oxide layer and a dummy gate electrode layer on a substrate; surrounding the dummy oxide layer and the dummy gate electrode layer with a sacrificial layer; surrounding the sacrificial layer with a nitrogen-containing dielectric layer; surrounding the nitrogen-containing dielectric layer with an interlayer dielectric layer; removing the dummy gate electrode layer; removing the dummy oxide layer; removing the sacrificial layer to form an opening in the nitrogen-containing dielectric layer; and depositing a gate dielectric; and depositing a gate electrode.

19 Claims, 10 Drawing Sheets

METHOD FOR FABRICATING A GATE STRUCTURE

TECHNICAL FIELD

The disclosure relates to integrated circuit fabrication, and more particularly to a semiconductor device with a gate structure.

BACKGROUND

As the technology nodes shrink, in some integrated circuit (IC) designs, there has been a desire to replace the typically polysilicon gate electrode with a metal gate electrode to improve device performance with the decreased feature sizes. In one process of forming a metal gate structure, known as "gate last" process, the final gate structure is fabricated "last," which allows reduced number of subsequent processes, including high temperature processing, that must be performed after formation of the gate.

Additionally, as the dimensions of transistors decrease, the thickness of the gate oxide must be reduced to maintain performance with the decreased gate length. In order to reduce gate leakage, high-dielectric-constant (high-k) gate dielectric layers are also used which allow greater physical thicknesses while maintaining the same effective thickness as would be provided by a thinner layer of the gate oxide used in larger technology nodes.

However, there are challenges to implementing such features and processes in complementary metal-oxide-semiconductor (CMOS) fabrication. As the gate length and spacing between devices decrease, these problems are exacerbated. For example, in a "high-k last" fabrication process in which the final high dielectric constant (high-k) dielectric is fabricated last in a "gate last" process, an outer edge of a lightly doped source/drain (LDD) region may be offset from an outer edge of a metal gate electrode.

FIG. 1 shows a cross-sectional view of a semiconductor device 100 fabricated by a "high-k last" process with a conventional gate structure 142. The semiconductor device 100 can be formed over an active region 104 of a substrate 102 adjacent to isolation regions 106. The semiconductor device 100 comprises lightly doped source/drain (LDD) regions 122 and source/drain (S/D) regions 124 formed in the active region 104 of the substrate 102, a gate structure 142 comprising an interfacial layer 143, a gate dielectric layer 144 and a gate electrode 146 sequentially formed over the substrate 102. Additionally, gate spacers 132, contact etch stop layers (CESL) 134 and interlayer dielectric (ILD) layers 136 may surround the gate structure 142.

Due to the "high-k last" process, an outer edge 122e of the LDD region 122 is often offset a distance X from an outer edge 146e of the gate electrode 146. Such an offset could be of a distance enough to degrade device performance if its formation is not prevented. Accordingly, what is needed is an improved device and method of gate formation.

BRIEF DESCRIPTION OF THE DRAWINGS

The present disclosure is best understood from the following detailed description when read with the accompanying figures. It is emphasized that, in accordance with the practice in the industry, various features are not drawn to scale and are used for illustration purposes only. In fact, the dimensions of the various features may be arbitrarily increased or reduced for clarity of discussion.

DESCRIPTION

Figure 1:
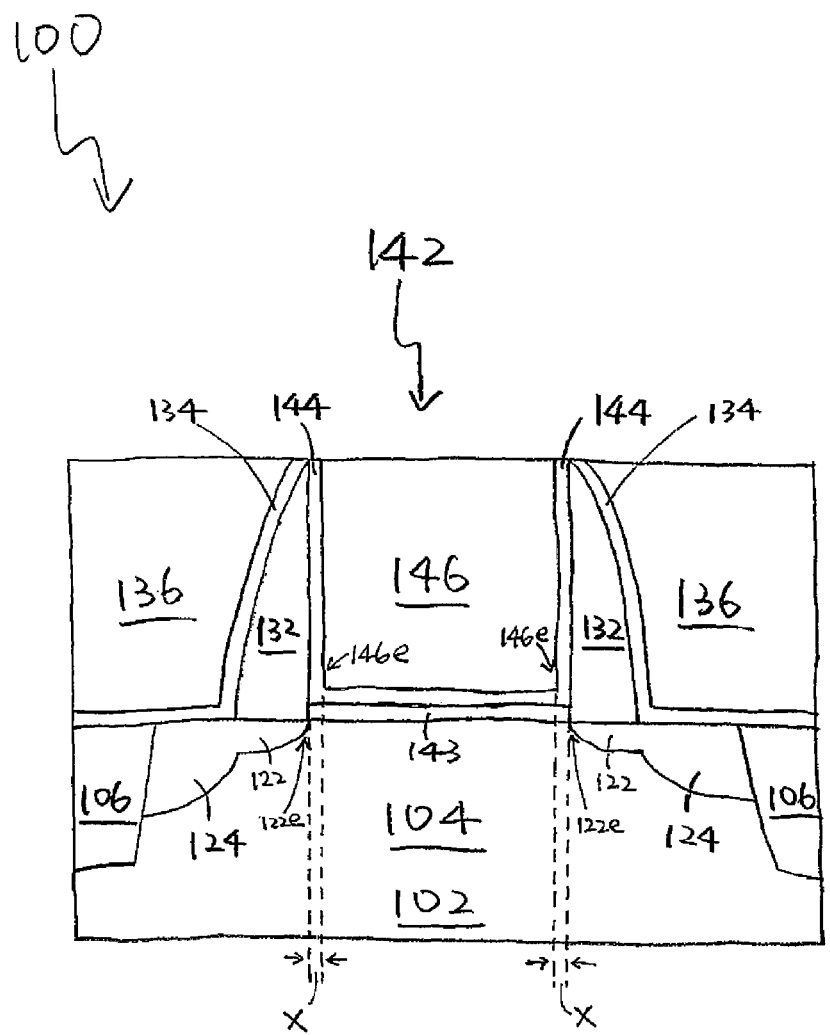
FIG. 1 shows a cross-sectional view of a semiconductor device with a conventional gate structure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 2:
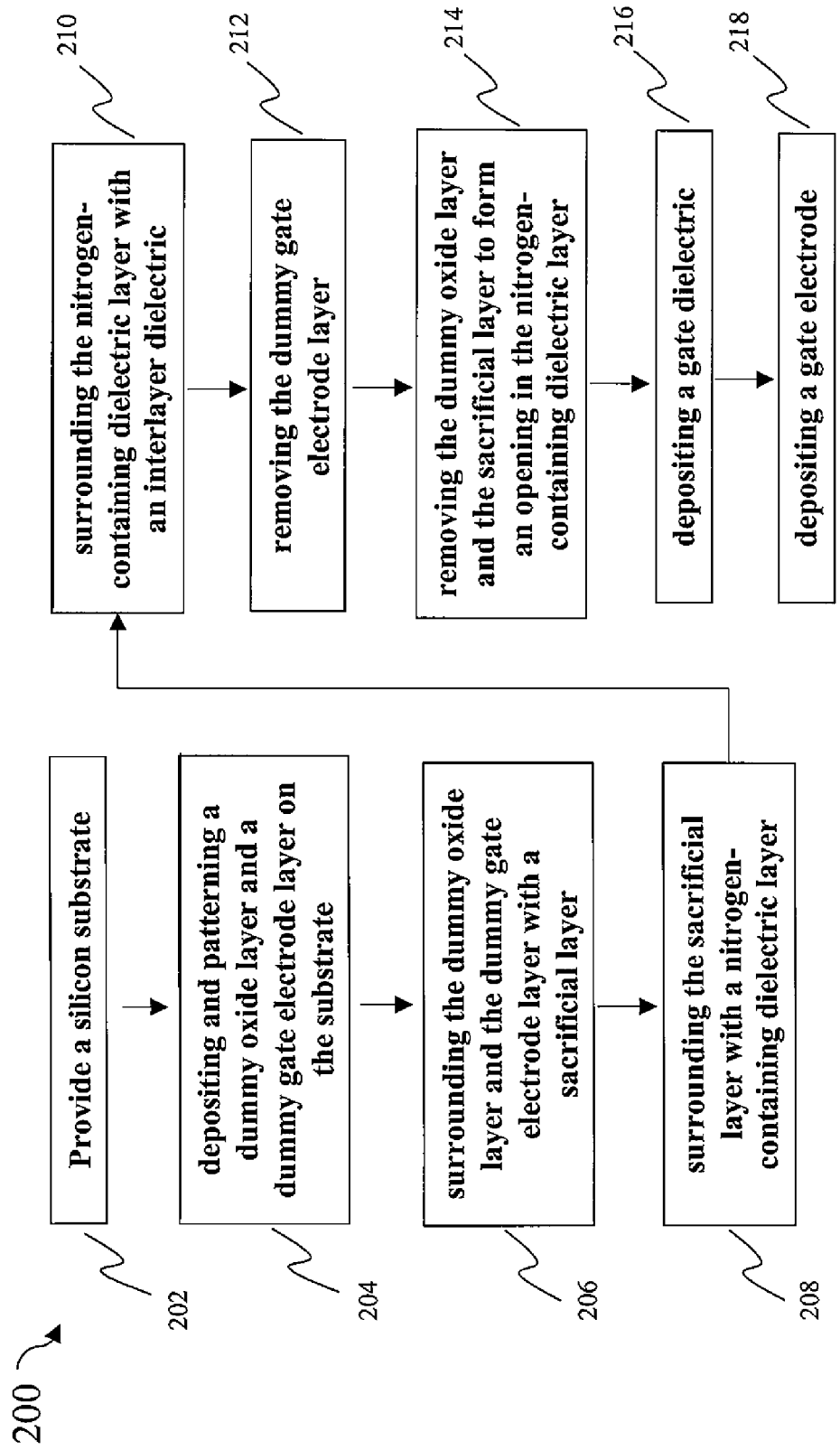
FIG. 2 is a flowchart illustrating a method for fabricating a gate structure according to various aspects of the present disclosure.

FIG. 2 is a flowchart illustrating a method 200 for fabricating a gate structure 342 (FIG. 3H) according to various aspects of the present disclosure. FIGS. 3A-H show schematic cross-sectional views of the gate structure 342 at various stages of fabrication according to an embodiment of the method 200 of FIG. 2. It is understood that other parts of the semiconductor devices 300 may be fabricated with normal complementary metal-oxide-semiconductor (CMOS) technology processes, and thus some processes are briefly described herein. Also, FIGS. 2 through 3H are simplified for a better understanding of the inventive concepts of the present disclosure. For example, although the figures illustrate the gate structure 342 for the semiconductor devices 300, it is understood the IC may include a number of other devices including resistors, capacitors, inductors, fuses, etc.

Figure 3A:
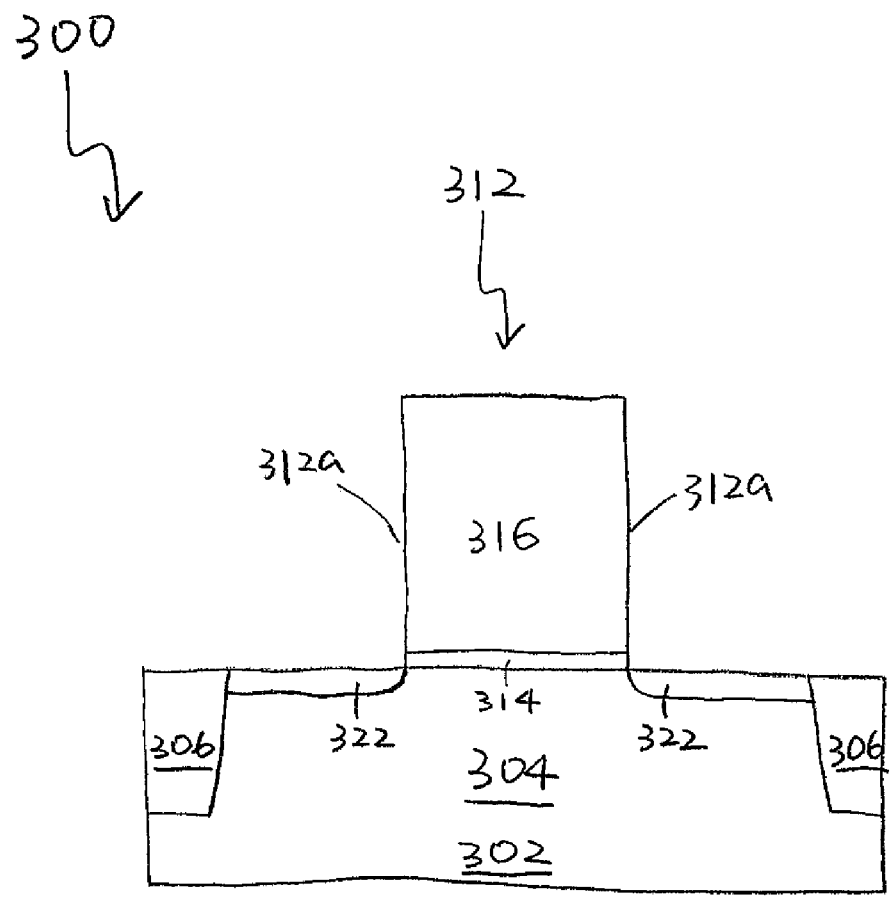
FIGS. 3A-H show schematic cross-sectional views of a gate structure at various stages of fabrication according to an embodiment of the method of FIG. 2.

Referring to FIGS. 2 and 3A, the method 200 begins at step 202 wherein a substrate 302 comprising active regions 304 and isolation regions 306 is provided. In one embodiment, the substrate 302 comprises a crystalline silicon substrate (e.g., wafer). In some alternative embodiments, the substrate 302 may comprise silicon germanium, gallium arsenic, or other suitable semiconductor materials. The substrate 302 may further comprise other features such as various doped regions, a buried layer, and/or an epitaxy layer. Furthermore, the substrate 302 may be a semiconductor on insulator such as silicon on insulator (SOI). In other embodiments, the substrate 302 may comprise a doped epi layer, a gradient semiconductor layer, and/or may further include a semiconductor layer overlying another semiconductor layer of a different type such as a silicon layer on a silicon germanium layer. In other examples, the semiconductor substrate 302 may comprise a compound semiconductor or a multilayer silicon structure or a silicon substrate may include a multilayer compound semiconductor structure.

The active regions 304 may include various doping configurations depending on design requirements as known in the art. In some embodiments, the active regions 304 may be doped with p-type or n-type dopants. For example, the active regions 304 may be doped with p-type dopants, such as boron or $BF_2$; n-type dopants, such as phosphorus or arsenic; and/or combinations thereof. The active regions 304 may act as regions configured for an N-type metal-oxide-semiconductor transistor device (referred to as an NMOS) and regions configured for a P-type metal-oxide-semiconductor transistor device (referred to as a PMOS).

The isolation regions 306 may be formed on the substrate 302 to isolate the various active regions 304. In some embodiments, The isolation regions 306 may utilize isolation technology, such as local oxidation of silicon (LOCOS) or shallow trench isolation (STI), to define and electrically isolate the various active regions 304. In the present embodiment, the isolation region 306 includes an STI. The isolation regions 306 may comprise silicon oxide, silicon nitride, silicon oxynitride, fluoride-doped silicate glass (FSG), a low-K dielectric material, other suitable materials, and/or combinations thereof. The isolation regions 306, and in the present embodiment, the STI, may be formed by any suitable process. As one example, the formation of the STI may include patterning the semiconductor substrate 302 by a conventional photolithography process, etching a trench in the substrate 302 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIGS. 2 and 3A, the method 200 continues with step 204 in which a dummy gate structure 312 is formed by sequentially depositing and patterning a dummy oxide layer 314 and a dummy gate electrode layer 316 on the substrate 302. The dummy gate structure 312 may be formed using any suitable process. In one example, the dummy oxide layer 314 and dummy gate electrode layer 316 are sequentially deposited on the substrate 302. In the present embodiment, the dummy oxide layer 314 may be formed of silicon oxide grown by a thermal oxidation process, having a thickness of about 10 to 30 Å. For example, in some embodiments, the dummy oxide layer 314 can be grown by the rapid thermal oxidation (RTO) process or in a conventional annealing process comprising oxygen. In some embodiments, the dummy gate electrode layer 316 may comprise a single layer or multilayer structure. In the present embodiment, the dummy gate electrode layer 316 may comprise poly-silicon. Further, the dummy gate electrode layer 316 may be doped poly-silicon with the same or different doping. The dummy gate electrode layer 316 comprises any suitable thickness. In the present embodiment, the dummy gate electrode layer 316 comprises a thickness in the range of about 30 nm to about 60 nm. The dummy electrode layer 316 may be formed using a low-pressure chemical vapor deposition (LPCVD) process. The LPCVD process can be carried out in a standard LPCVD furnace at a temperature of about 580° C. to 650° C., and at a pressure of about 200 mTorr to 1 Torr, using silane ($SiH_4$), disilane ($Si_2H_6$), trisilane ($Si_3H_8$) or dichlorosilane ($SiH_2Cl_2$) as silicon source gas.

Then, a layer of photoresist is formed over the dummy gate structure 312 by a suitable process, such as spin-on coating, and patterned to form a patterned photoresist feature by a proper lithography patterning method. A width of the patterned photoresist feature is in the range of about 15 to 45 nm. The patterned photoresist feature can then be transferred using a dry etching process to the underlying layers (i.e., the dummy oxide layer 314 and the dummy gate electrode layer 316) to form the dummy gate structure 312. The photoresist layer may be stripped thereafter. In another example, a hard mask layer is formed over the dummy gate structure 312; a patterned photoresist layer is formed on the hard mask layer; the pattern of the photoresist layer is transferred to the hard mask layer and then transferred to the dummy gate electrode layer 316 and the dummy oxide layer 314 to form the dummy gate structure 312. It is understood that the above examples do not limit the processing steps that may be utilized to form the dummy gate structure 312. It is further understood that the dummy gate structure 312 may comprise additional dielectric layers and/or conductive layers. For example, the dummy gate structure 312 may comprise hard mask layers, interfacial layers, capping layers, diffusion/barrier layers, other suitable layers, and/or combinations thereof.

Also shown in FIG. 3A, after formation of the dummy gate structure 312, lightly doped source and drain (LDD) regions 322 may be created in the active region 304 of the substrate 302. The LDD regions 322 may be formed in the active region 304 by one or more implantation processes, such as an ion implantation process. The doping species may depend on the type of device being fabricated, such as an NMOS or PMOS device. For example, the LDD regions 322 may be doped with p-type dopants, such as boron or $BF_2$; n-type dopants, such as phosphorus or arsenic; and/or combinations thereof. The LDD regions 322 may comprise various doping profiles. In some embodiments, this is accomplished via ion implantation of boron or phosphorous, at an energy level between about 5 to 100 KeV, at a dose between about 1E11 to 1E14 atoms/cm2. The LDD regions 322 may be aligned with sidewall surfaces 312a of the dummy gate structure 312 following the ion implantation process.

Figure 3B:
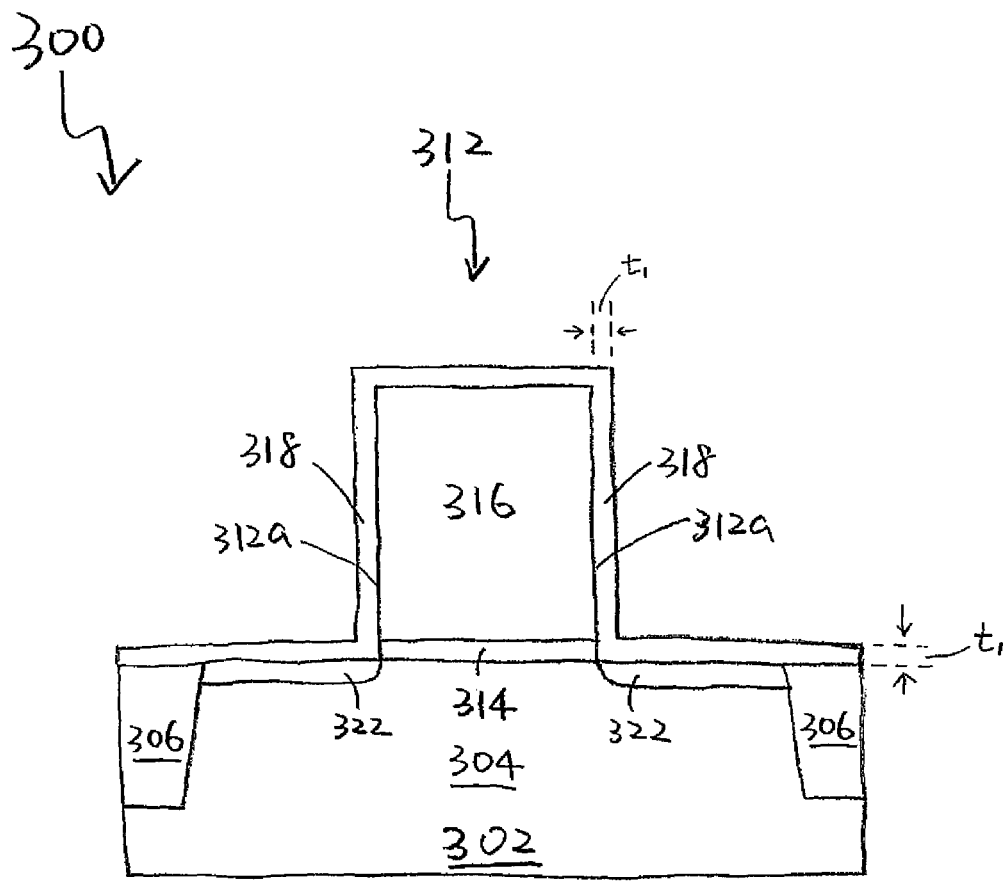

Referring to FIGS. 2 and 3B, the method 200 continues with step 206 in which a sacrificial layer 318 is formed to surround the dummy oxide layer 314 and the dummy gate electrode layer 316. The sacrificial layer 318 comprises any suitable thickness. In the present embodiment, a thickness t1 of the sacrificial layer 318 in the range of about 0.5 to 2 nm. In at least one embodiment, the sacrificial layer 318, such as a high-k dielectric layer, may be different from the dummy oxide layer 314. The high-k dielectric layer may comprise hafnium oxide ($HfO_2$). The high-k dielectric layer can be deposited using atomic layer deposition (ALD) process. The ALD process of the present invention is generally carried out under a pressure less than 10 mTorr and in the temperature range from about 150° C. to 300° C. In at least one embodiment, the hafnium oxide is deposited by reacting a hafnium source compound and an oxygen source. The hafnium source compound provides hafnium to the deposited hafnium oxide and may be hafnium tetrakisdimethylamine, having a chemical formula of $Hf[N(CH4)2]4$. The oxygen source provides oxygen to the deposited hafnium oxide and may be water vapor ($H2O$).

In some other embodiment, the sacrificial layer 318, such as silicon oxide, fluorine-doped silicon oxide, or carbon-doped silicon oxide, may be the same material or similar to the dummy oxide layer 314. This is because both are silicon oxides but one could have other components. The silicon oxide, fluorine-doped silicon oxide, or carbon-doped silicon oxide can be deposited using chemical vapor deposition (CVD) process. For example, the CVD process of the present invention is generally carried out under a source radio frequency power of from about 400 to about 800 W, at a pressure of about 2.5 to 4 Torr, and at a temperature of about 250 to 400° C., using silane ($SiH4$) or silicon tetrafluoride ($SiF4$) or trimethylsilane ($Si(CH3)3H$) or tetramethylsilane ($Si(CH3)4$), along with O2 as reacting precursors.

Figure 3C:
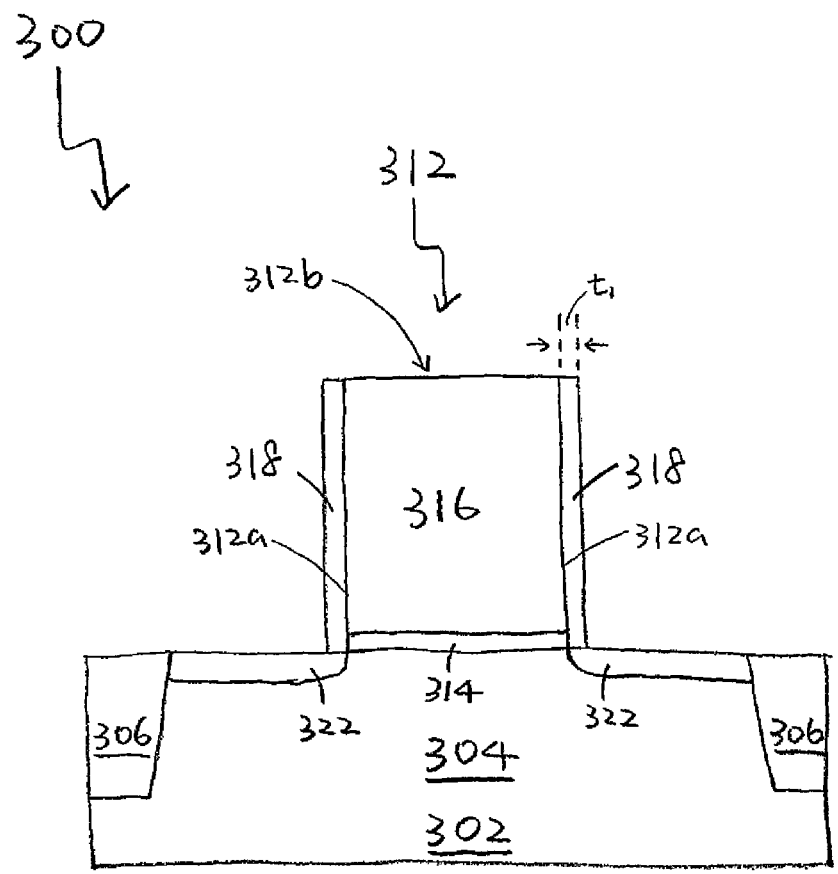

Referring to FIG. 3C, a portion of the sacrificial layer 318 on a top surface 312b of the dummy gate structure 312 is removed using an anisotropic dry etching process, whereby the sacrificial layer 318 that surrounds and adjoins the sidewall surfaces 312a of the dummy gate structure 312 will remain after the etching process. It should be noted that removing the sacrificial layer 318 later increases dimensions of the final gate structure 342 (see FIG. 3H). The increased dimensions of the final gate structure 342 may accommodate the thickness of gate dielectric in the "high-k last" process, thereby eliminating the offset X between the outer edge 122e of the LDD region 122 and the outer edge 146e of the gate electrode 146 shown in FIG. 1.

The dry etching process has a high selectivity such that the dry etching process does not etch into the surfaces of the dummy gate electrode layer 316 and the substrate 302. In one embodiment, the dry etching process to etch the hafnium oxide may be performed under a source power of about 200 to 2500 W and a cathode bias power of about 5 to 100 W, and at a pressure of about 3 to 5 mTorr, using Cl2 and CO as etching gases. In another embodiment, the dry etching process to etch silicon oxide, fluorine-doped silicon oxide, and carbon-doped silicon oxide may be performed under a glow discharge and a pressure of about 10 mTorr to 3 Torr, using fluorocarbon gas, such as CF4, C2F6, C3F8, CHF3, or CH2F2, as etching gases.

Figure 3D:
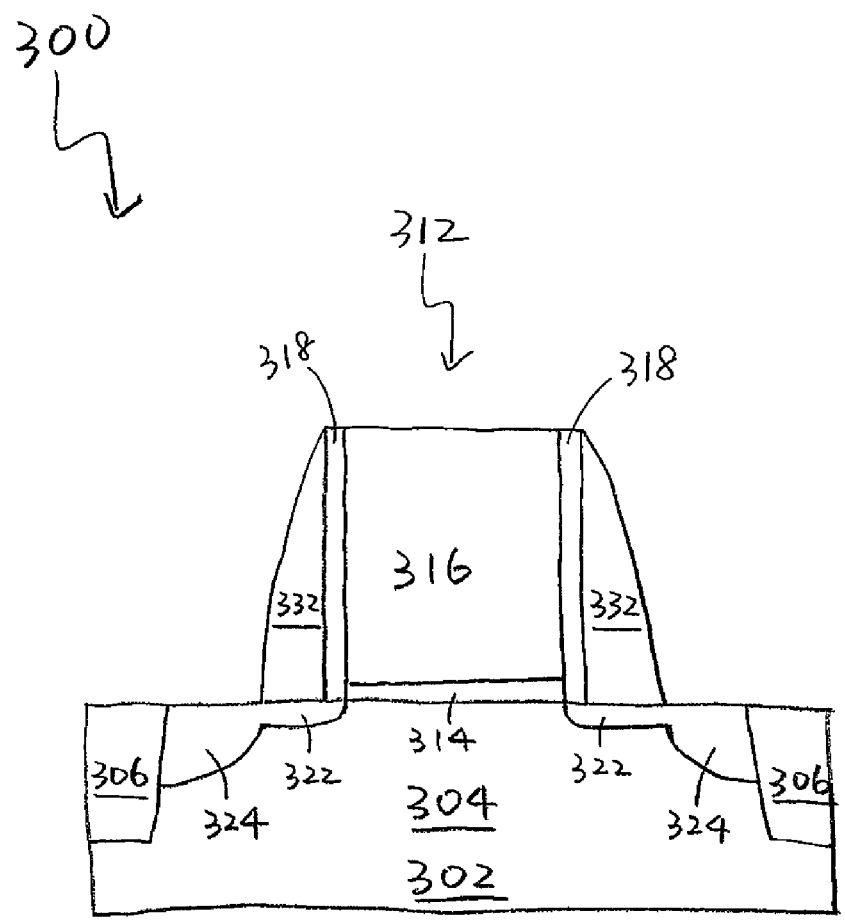

Referring to FIGS. 2 and 3D, the method 200 continues with step 208 in which a nitrogen-containing dielectric layer 332 is formed to surround the sacrificial layer 318. In one embodiment, the nitrogen-containing dielectric layer 332 may be a silicon nitride layer formed by plasma deposition at a temperature less than 400° C. and at a pressure of about 200 mTorr to 1 Torr, using SiH4, NH3 and/or N2O as reaction gases. The nitrogen-containing dielectric layer 332 may comprise silicon nitride, silicon oxynitride, and/or combinations thereof. The nitrogen-containing dielectric layer 332 may comprise a multilayer structure. In the present embodiment, the nitrogen-containing dielectric layer 332 comprises a thickness in the range of about 7 nm to about 15 nm And then, a dry etching process may be performed under a source power of about 150 to 220 W, and a pressure of about 10 to 45 mTorr, using BP, CH2F2, O2, He, and Ar as etching gases. The remaining nitrogen-containing dielectric layer 332 acts as gate spacers and refers to as gate spacers 332.

Still referring to FIGS. 3D, the gate spacers 332 may be used to offset source/drain (S/D) regions 324. The S/D regions 324 may be formed in the active regions 304 of the substrate 302 by one or more ion implantation processes. The doping species may depend on the type of device being fabricated, such as an NMOS or PMOS device. For example, the S/D regions 324 may be doped with p-type dopants, such as boron or $BF_2$; n-type dopants, such as phosphorus or arsenic; and/or combinations thereof. The S/D regions 324 may comprise various doping profiles, and the S/D regions 324 may be aligned with an outer edge of the spacers 332 following the ion implantation process. This is achieved via ion implantation of boron or phosphorous, at an energy level between about 5 to 150 KeV, at a dose between about 1E15 to 1E 16 atoms/cm2. The S/D regions 324 may further include raised S/D regions in some embodiments. Also, one or more contact features (e.g., silicide regions) may be formed on the S/D regions 324 by a self-aligned silicidation process.

Figure 3E:
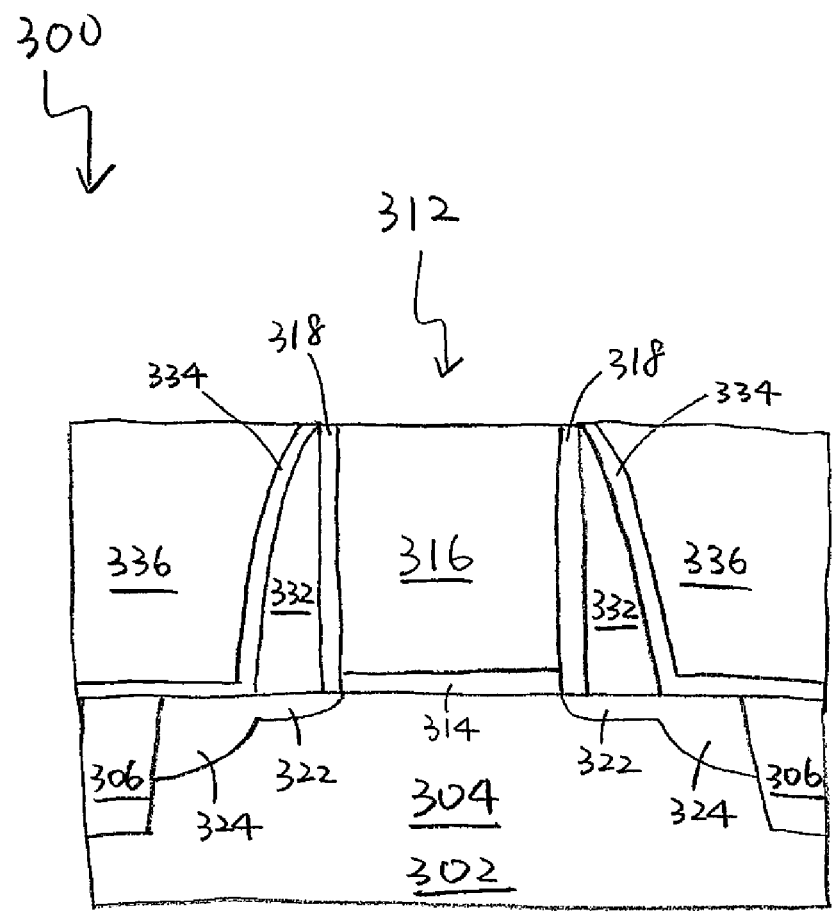

Referring to FIGS. 2 and 3E, the method 200 continues with step 210 in which an interlayer dielectric (ILD) layer 336 is formed to surround the nitrogen-containing dielectric layer 332. Before formation of the ILD layer 336, an optional contact etch stop layer (CESL) 334 may be formed over the substrate 302, including over the dummy gate structure 312, by any suitable process, including the processes described herein. The CESL 334 may be formed by plasma deposition at a temperature of about 300° C. to about 600° C., at a pressure of about 200 mTorr to 1 Torr, high frequency RF powers of about 70 W to about 300 W and low frequency RF powers of about 5 W to 60 W, using silane (SiH4) and/or hexacholorodisilane (Si2Cl6) and NH3 as reaction gases. The CESL 334 further comprises any suitable thickness. In the present embodiment, the CESL comprises a thickness of about 200 Å. In some embodiments, the CESL 334 is not used.

Still referring to FIGS. 3E, following formation of the CESL 334, the ILD layer 336 may be formed over the CESL 334. The ILD layer 336 may comprise a dielectric material. The dielectric material may comprise silicon oxide, spin-on glass (SOG), fluorinated silica glass (FSG), carbon doped silicon oxide (e.g., SiCOH), Black Diamond® (Applied Materials of Santa Clara, Calif.), other suitable dielectric materials, and/or combinations thereof. In some embodiments, the ILD layer 336 may include a high density plasma (HDP) dielectric material (e.g., HDP oxide) and/or a high aspect ratio process (HARP) dielectric material (e.g., HARP oxide). The ILD layer 336 comprises any suitable thickness. In the present embodiment, ILD layer 336 comprises a thickness in the range of about 4000 Å to about 8000 Å. It is understood that the ILD layer 336 may comprise one or more dielectric materials and/or one or more dielectric layers.

Subsequently, the CESL 334 and/or ILD layer 336 may be planarized by a chemical-mechanical-polishing (CMP) process until a top portion of the dummy gate structure 312 overlying the substrate 302 is exposed as illustrated in FIG. 3E. The CMP process may have a high selectivity to provide a substantially planar surface for the dummy gate structure 312, sacrificial layer 318, gate spacers 332, CESL 334, and ILD layer 336. In the present embodiment, the dummy oxide layer 314 and the dummy gate electrode layer 316 may be surrounded with dielectrics comprising the sacrificial layer 318, gate spacers 332 (i.e., the nitrogen-containing dielectric layer 332), CESL 334, and ILD layer 336.

Figure 3F:
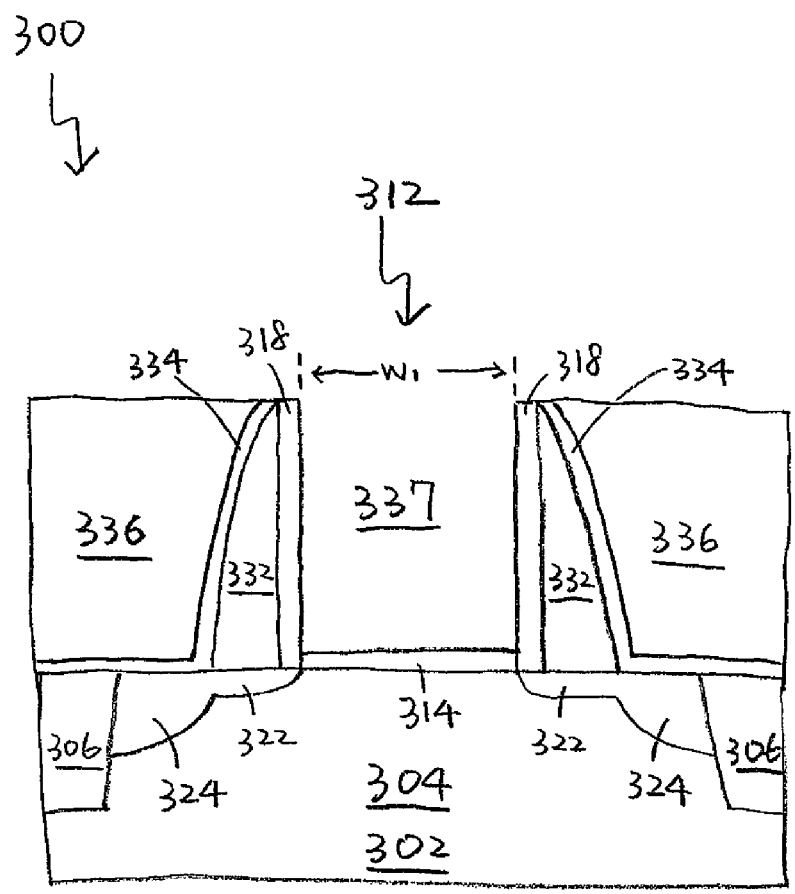

Referring to FIGS. 2 and 3F, the method 200 continues with step 212 in which the dummy gate electrode layer 316 is removed from the dummy gate structure 312, which is surrounded with the sacrificial layer 318, gate spacers 332, CESL 334, and ILD layer 336. The dummy gate electrode layer 316 may be removed by any suitable process to form an opening 337 with a first width W1 in the sacrificial layer 318. The dummy gate electrode layer 316 may be removed using a wet etch and/or a dry etch process. In one embodiment, the wet etch process for dummy poly-silicon gate electrode layer 316 includes exposure to a solution containing ammonium hydroxide, diluted HF, deionized water, and/or other suitable etchant solutions. In some other embodiment, the dry etch process for the dummy poly-silicon gate electrode layer 316 may be performed under a source power of about 650 to 800 W, a bias power of about 100 to 120 W, and a pressure of about 60 to 200 mTorr, using Cl2, HBr and He as etching gases.

Figure 3G:
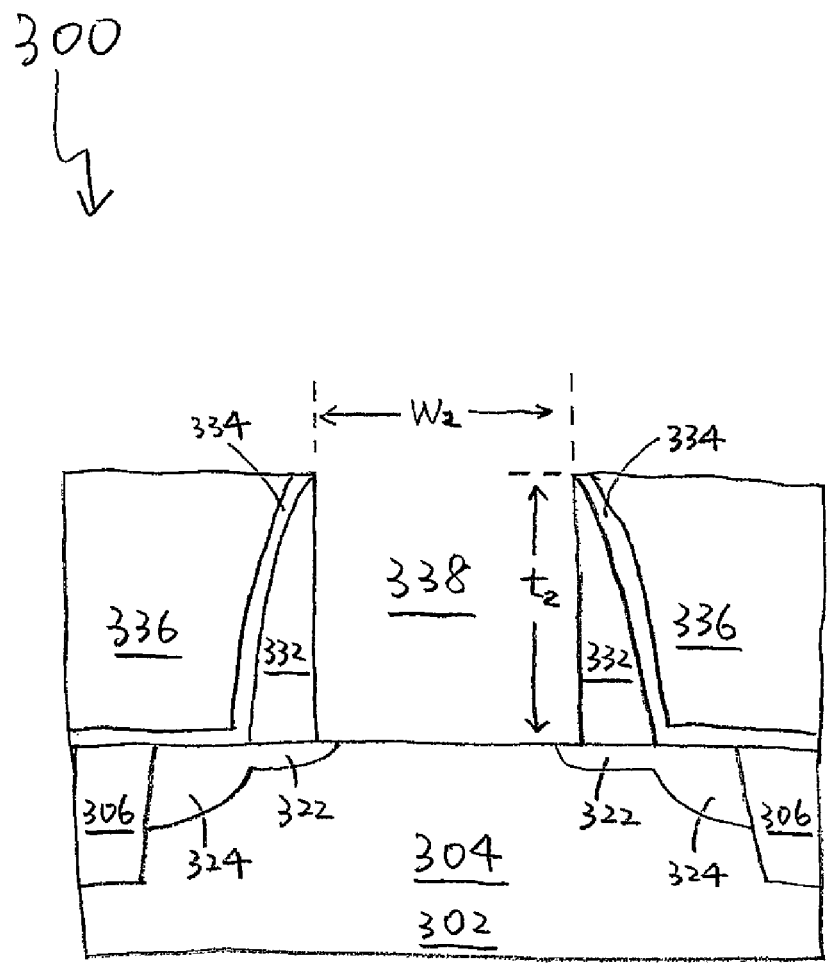
Figure 3H:
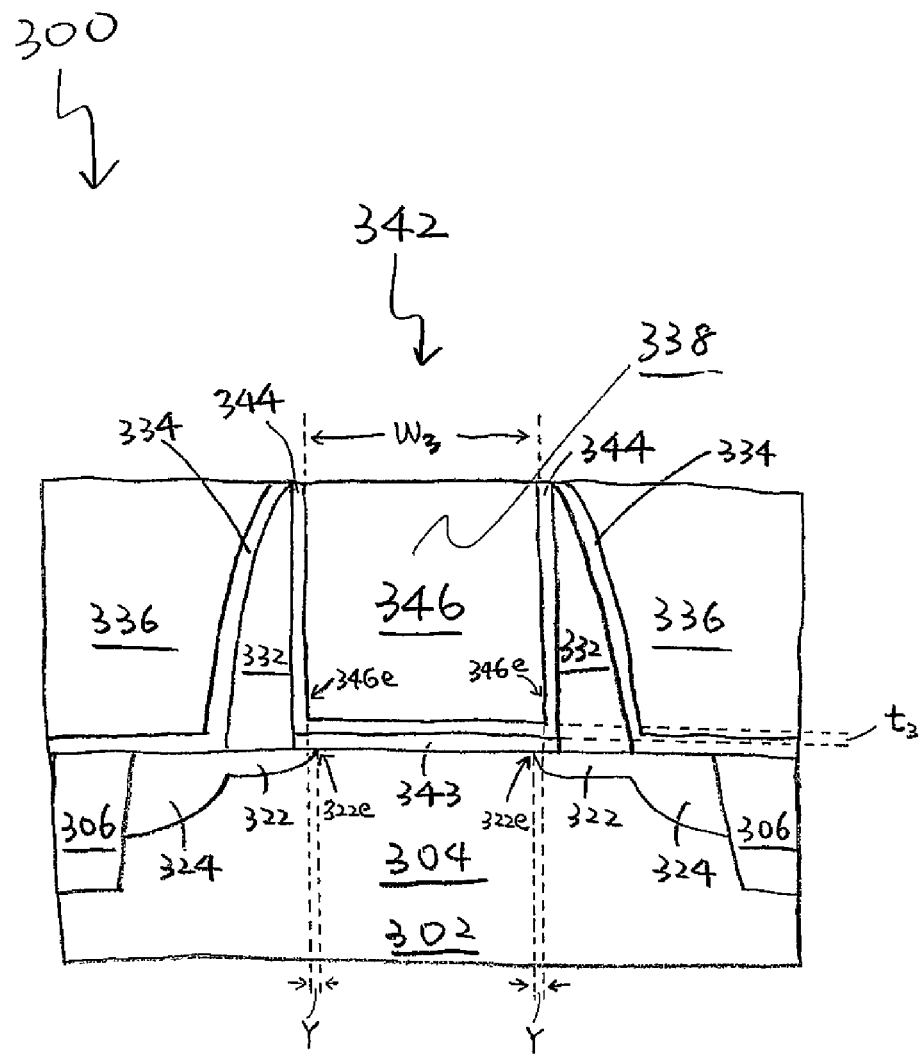

Referring to FIGS. 2 and 3G, the method 200 continues with step 214 in which the dummy oxide layer 314 and the sacrificial layer 318 may be removed to form an opening 338 in the nitrogen-containing dielectric layer 332. In one embodiment, a second width W2 of the opening 338 is in the range of about 15 to 45 nm, and a height t2 of the opening 338 is in the range of about 30 to 60 nm. It should be noted that the second width W2 of the opening 338 is larger than the first width of the opening 337. Accordingly, applicant's method of fabricating the semiconductor device 300 may increase the dimensions of the final gate structure 342 (see FIG. 3H). The increased dimensions of the final gate structure 342 are wide enough to accommodate the thickness of gate dielectric in the "high-k last" process, thereby eliminating the offset X between the outer edge 122e of the LDD region 122 and the outer edge 146e of the gate electrode 146 shown in FIG. 1, thereby maintaining the device performance.

In some embodiments, the sacrificial layer 318 is formed of a different material than the dummy oxide layer 314. Since the sacrificial layer 318 and dummy oxide layer 314 are made of different materials, they can be removed separately. In one embodiment, the step of removing the dummy oxide 314 is after the step of removing the sacrificial layer 318 to form the opening 338 in the nitrogen-containing dielectric layer 332. In another embodiment, the step of removing the dummy oxide 314 is before the step of removing the sacrificial layers 318 to form the opening 338 in the nitrogen-containing dielectric layer 332. In one embodiment in which the sacrificial layer 318 and dummy oxide layer 314 are different materials, the sacrificial layer 318 comprises a high-k dielectric, such as HfO2, and the dummy oxide layer 314 comprises a silicon oxide.

In the present embodiment, the step of removing the dummy oxide layer 314 is performed using a wet etching process, a dry etching process, or a vapor etching process. The etching processes may have a high selectivity such that the etching process may stop at the nitrogen-containing dielectric layer 332, CESL 334, ILD layer 336 and the substrate 302. For example, the wet etching process comprises removing the dummy oxide layer 314 in hydrofluoric acid (HF) solution for a suitable time. For another example, the dry etching process is performed using F or Cl based etchants. For another example, the vapor etching process is performed by exposing a surface of the dummy oxide layer 314 to a vapor mixture comprising NH3 and HF at a temperature between 20° C. and 70° C. In the present embodiment, the step of removing the sacrificial layer 318 to form an opening 338 in the nitrogen-containing dielectric layer 332 is performed using a dry etching process. The dry etching process may have a high selectivity such that the dry etching process may stop at the nitrogen-containing dielectric layer 332, CESL 334, ILD layer 336 and the substrate 302. For example, the dry etching process is performed under a source power of about 450 to 550 W, and a pressure of about 1 to 2 mTorr, using Cl2 and BCl3 as etching gases.

In another embodiment, the sacrificial layer 318, such as silicon oxide, fluorine-doped silicon oxide, or carbon-doped silicon oxide, may be the same material or similar to the dummy oxide layer 314. This is because both are silicon oxides but one could have other components. Therefore, the dummy oxide and the sacrificial layers 314, 318 may be simultaneously removed to form the opening 338 in the nitrogen-containing dielectric layer 332. In the present embodiment, where both layers are silicon oxides, the step of removing the dummy oxide and the sacrificial layers 314, 318 simultaneously to form the opening 338 in the nitrogen-containing dielectric layer 332 is performed using a wet etching process. The wet etching process may have a high selectivity such that the wet etching process may stop at the nitrogen-containing dielectric layer 332, CESL 334, ILD layer 336 and the substrate 302. For example, the wet etching process comprises removing the dummy oxide and the sacrificial layers 314, 318 simultaneously in hydrofluoric acid (HF) solution for a suitable time.

Referring to FIGS. 2 and 3H, the method 200 continues with step 216 in which a gate dielectric 344 may be deposited to partially fill the opening 338 to form a portion of a gate structure 342. In some embodiments, the gate dielectric layer 344 may comprise silicon oxide, silicon oxynitride, high-k dielectric layer or combination thereof. The high-k dielectric layer may comprise hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, silicon nitride, silicon oxynitride, zirconium oxide, titanium oxide, aluminum oxide, hafnium dioxide-alumina ($HfO_2$—$Al_2O_3$) alloy, other suitable high-k dielectric materials, and/or combinations thereof. In some embodiments, the high-k gate dielectric has a thickness t3 less than 2 nm in the opening 338. It should be noted that this thickness t3 should also be less than the thickness t1 of the sacrificial layer 318, so that the remaining width W3 of the opening 338 is larger the width W1 of the opening 337 in FIG. 3F to eliminate the offset X between the outer edge 122e of the LDD region 122 and the outer edge 146e of the gate electrode 146 shown in FIG. 1, thereby creating an overlap Y between the outer edge 322e of the LDD region 322 and a outer edge 346e of a gate electrode 346. The gate dielectric layer 344 may further comprise an interfacial layer 343 to reduce the mismatch between the gate dielectric layer 344 and the substrate 302. The interfacial layer 343 may comprise silicon oxide.

Referring to FIGS. 2 and 3H, the method 200 continues with step 218 in which a gate electrode 346 may be deposited to completely fill the opening 338 to form the gate structure 342. In some embodiments, the gate electrode 346 comprises a material selected from a group of Al, Cu, AlTi, AlTiN, TiN, TiCN, TaN, TaCN, WN and WCN. In some embodiments, the metal gate electrode 342 has a gate length less than 32 nm in the opening 338. After filling the opening 338 with the gate dielectric 344 and the gate electrode 346, a CMP process may be performed to planarize the gate dielectric 344 and a gate electrode 346. The CMP process may remove a portion of the gate dielectric 344 and gate electrode 346 until the top surface of the ILD layer 334 is reached. Then, subsequent processes, including interconnect processing, must be performed after forming the gate structure 342 to complete the semiconductor device 300 fabrication.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The invention can be used to form or fabricate a gate structure for semiconductor devices. In this way, applicant's method of fabricating the semiconductor devices may overlap the outer edge of a LDD region and the outer edge of a gate electrode thereby maintaining the device performance.

What is claimed is:

1. A method for fabricating a gate structure, comprising:
   depositing and patterning a dummy oxide layer and a dummy gate electrode layer on a substrate;
   forming a lightly doped region in the substrate;
   surrounding the dummy oxide layer and the dummy gate electrode layer with a hafnium oxide sacrificial layer;
   surrounding the hafnium oxide sacrificial layer with a nitrogen-containing dielectric layer;
   surrounding the nitrogen-containing dielectric layer with a contact etch stop layer (CESL);
   surrounding the CESL with an interlayer dielectric layer;
   removing the dummy gate electrode layer;
   removing the dummy oxide layer;

substantially completely removing the hafnium oxide sacrificial layer to form an opening in the nitrogen-containing dielectric layer;

depositing a gate dielectric, wherein depositing the gate dielectric comprises depositing the gate dielectric along sidewalls of the nitrogen-containing layer; and depositing a gate electrode, wherein depositing the gate electrode comprises depositing the gate electrode such that the lightly doped region extends beyond an interface of the gate electrode and the gate dielectric.

2. The method of claim 1, wherein the step of removing the dummy oxide is after the step of removing the hafnium oxide sacrificial layers to form an opening in the nitrogen-containing dielectric layer.

3. The method of claim 1, wherein the step of removing the dummy oxide is before the step of removing the hafnium oxide sacrificial layers to form an opening in the nitrogen-containing dielectric layer.

4. The method of claim 1, wherein the steps of removing the dummy oxide and removing the hafnium oxide sacrificial layers to form an opening in the nitrogen-containing dielectric layer are performed simultaneously.

5. The method of claim 1, wherein the step of removing the dummy oxide layer is performed using a wet etching process.

6. The method of claim 5, wherein the wet etching process comprises removing the dummy oxide layer in hydrofluoric acid (HF) solution.

7. The method of claim 1, wherein a thickness of the hafnium oxide sacrificial layer is in the range of about 0.5 to 2 nm.

8. The method of claim 1, wherein the step of removing the hafnium oxide sacrificial layer to form an opening in the nitrogen-containing dielectric layer is performed using a dry etching process.

9. The method of claim 8, wherein the dry etching process is performed under a source power of about 450 to 550W, and a pressure of about 1 to 2 mTorr, using $Cl_2$ and $BCl_3$ as etching gases.

10. The method of claim 1, wherein the steps of removing the dummy oxide and removing the hafnium oxide sacrificial layers to form an opening in the nitrogen-containing dielectric layer is performed using a wet etching process simultaneously.

11. The method of claim 10, wherein the wet etching process comprises removing the dummy oxide and the hafnium oxide sacrificial layers simultaneously in hydrofluoric acid (HF) solution.

12. The method of claim 1, wherein a width of the opening is in the range of about 15 to 45 nm.

13. The method of claim 1, wherein a height of the opening is in the range of about 30 to 60 nm.

14. A method for fabricating a gate structure, comprising:

depositing and patterning a dummy oxide layer and a dummy gate electrode layer on a substrate;

forming a lightly doped region in the substrate;

surrounding the dummy oxide layer and the dummy gate electrode layer with a hafnium oxide sacrificial layer;

surrounding the hafnium oxide sacrificial layer with a nitrogen-containing dielectric layer;

surrounding the nitrogen-containing dielectric layer with a contact etch stop layer (CESL);

surrounding the CESL with an interlayer dielectric layer;

removing the dummy gate electrode layer;

substantially completely removing the dummy oxide and the hafnium oxide sacrificial layers simultaneously to form an opening in the nitrogen-containing dielectric layer;

depositing a gate dielectric, wherein depositing the gate dielectric comprises depositing the gate dielectric along sidewalls of the nitrogen-containing layer; and depositing a gate electrode, wherein depositing the gate electrode comprises depositing the gate electrode such that the lightly doped region extends beyond a sidewall of the gate electrode closest to the nitrogen-containing dielectric layer.

15. The method of claim 14, wherein a thickness of the hafnium oxide sacrificial layer is in the range of about 0.5 to 2 nm.

16. The method of claim 14, wherein the step of removing the dummy oxide and the hafnium oxide sacrificial layers simultaneously to form an opening in the nitrogen-containing dielectric layer is performed using a wet etching process.

17. The method of claim 16, wherein the wet etching process comprises removing the dummy oxide and the hafnium oxide sacrificial layers simultaneously in hydrofluoric acid (HF) solution.

18. The method of claim 14, wherein a width of the opening is in the range of about 15 to 45 nm.

19. The method of claim 14, wherein a height of the opening is in the range of about 30 to 60 nm.

\* \* \* \* \*